(12) United States Patent
Greim et al.

(10) Patent No.: US 6,743,985 B1
(45) Date of Patent: Jun. 1, 2004

(54) METHOD AND APPARATUS FOR INCREASED ROUTING DENSITY ON PRINTED CIRCUIT BOARDS WITH DIFFERENTIAL PAIRS

(75) Inventors: Michael C. Greim, Round Rock, TX (US); Patrick W. Carrier, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 10/370,164

(22) Filed: Feb. 19, 2003

(51) Int. Cl.[7] .................................................. H05K 7/06
(52) U.S. Cl. ...................................... 174/261; 174/262
(58) Field of Search ................................ 361/777, 778, 361/780, 794; 174/261, 262; 333/12, 246, 247, 260

(56) References Cited

U.S. PATENT DOCUMENTS

| | | | | |
|---|---|---|---|---|
| 1,924,840 A | | 8/1933 | Droste et al. .................. 174/36 |
| 2,086,629 A | | 7/1937 | Mead ......................... 333/24.3 |
| 5,006,820 A | * | 4/1991 | Prioste et al. ................... 333/33 |
| 5,308,926 A | * | 5/1994 | Auerbuch et al. ........... 174/250 |
| 6,215,062 B1 | | 4/2001 | Kimber ......................... 174/27 |
| 6,218,621 B1 | | 4/2001 | Kuczynski .............. 174/110 R |
| 6,486,405 B2 | | 11/2002 | Lin ......................... 174/113 R |
| 6,683,260 B2 | * | 1/2004 | Shimamoto et al. ........ 174/268 |

* cited by examiner

Primary Examiner—John B. Vigushin
(74) Attorney, Agent, or Firm—Hamilton & Terrile, LLP; Gary W. Hamilton (57) ABSTRACT

A method and apparatus for decreasing crosstalk between conductors, particularly differential pairs, that are routed in high-density patterns on printed circuit boards system. In one embodiment of the invention, a single-ended conductor is divided at a first point into two single-ended conductors of equal width, with the two single-ended conductors being routed around and alongside a differential pair of conductors. Equal and opposite noise is coupled onto each branch of the single-ended signal from each side of the differential pair. The two single-ended conductors are rejoined at a second point to form a combined single-ended conductor. Signals traveling along the two separate paths of the single-ended are combined at the second point and noise carried in the respective signals is cancelled. Noise coupled into the differential pair from the two single-ended paths is eliminated at the receiving end as common mode noise. In other embodiments of the present invention, the single-ended conductors and the differential pairs are oriented between two planes in stripline or dual stripline configurations. The method and apparatus of the present invention can be implemented in numerous media, such as vias and cables (including flex and ribbon).

20 Claims, 5 Drawing Sheets

METHOD AND APPARATUS FOR INCREASED ROUTING DENSITY ON PRINTED CIRCUIT BOARDS WITH DIFFERENTIAL PAIRS

BACKGROUND OF THE INVENTION

1. Field of the Invention

Present invention relates generally to circuit boards used in information handling systems. More specifically, the present invention provides an improved method and apparatus for increasing the routing density for circuit boards comprising differential conductor pairs.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As computers have increased in performance, it has become necessary to use higher data bit rates in high-density circuitry with minimal spacing between the various circuit conductors. As a result, it has become difficult to fabricate circuit boards that meet the needs of high performance computing technology using conventional circuit board manufacturing methods. The necessity for a more ideal transmission path vital to higher-performance electrical signals is in direct conflict with the minimization of both cost and size.

One of the most common trends for achieving higher performance is the use of Low Voltage Differential Signaling (LVDS) to transmit data both intra-box and interbox. LVDS uses a pair of signals of opposite polarity to transmit data. There are currently many busses that use LVDS to transmit data in the Gigahertz range. These busses require very fast edge rates to support the signal integrity of the digital waveforms they produce. As these become increasingly faster, crosstalk between differential pairs becomes a greater concern. Faster edge rates result in an environment where very short parallel runs of conductors can produce significant crosstalk, thus increasing the risk of corrupted data. Increasing the spatial isolation of signals to minimize crosstalk translates to a reduction in routing density. There is a need, therefore, for a method and apparatus to route these signals to achieve acceptable routing density while minimizing or eliminating crosstalk.

SUMMARY OF THE INVENTION

In view of the shortcomings of the prior art, there is a need for an improved method and apparatus for increasing the density of circuits on printed circuit boards, particularly those employing mixed-mode signal conductors and differential conductor pairs.

In accordance with the present invention, a method and apparatus is provided which substantially decreases crosstalk between conductors, particularly differential conductor pairs, that are routed in high-density patterns on printed circuit boards. In one embodiment of the invention, a single-ended conductor is divided at a first point into two single-ended conductors of equal width, with the two single-ended conductors being routed around and alongside a differential pair of conductors. In this embodiment, equal and opposite noise is coupled onto each branch of the single-ended signal from each side of the differential pair. The two single-ended conductors are rejoined at a second point to form a combined single-ended conductor. Signals traveling along the two separate single-ended conductor paths are combined at the second point and noise carried in the respective signals on the two paths is cancelled when the two paths are combined. Noise coupled into the differential pair from the two single-ended conductors is eliminated at the receiving end as common mode noise.

In other embodiments of the present invention, the single-ended conductors and the differential pairs can be oriented between two planes in stripline or dual stripline configurations. Furthermore, the present invention can be implemented by utilizing a single microstrip layer or a combination of a microstrip with buried microstrip. The method and apparatus of the present invention can be implemented in numerous other media, such as vias and cables (including flex and ribbon cables).

Utilizing the method and apparatus of the present invention, it is possible to achieve significantly greater conductor densities in circuit boards or similar structures because the noise rejection characteristics make it possible to take advantage of space that is wasted in prior art methods for routing single-ended conductors and differential conductor pairs where noise is reduced primarily by spatial isolation.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1A:
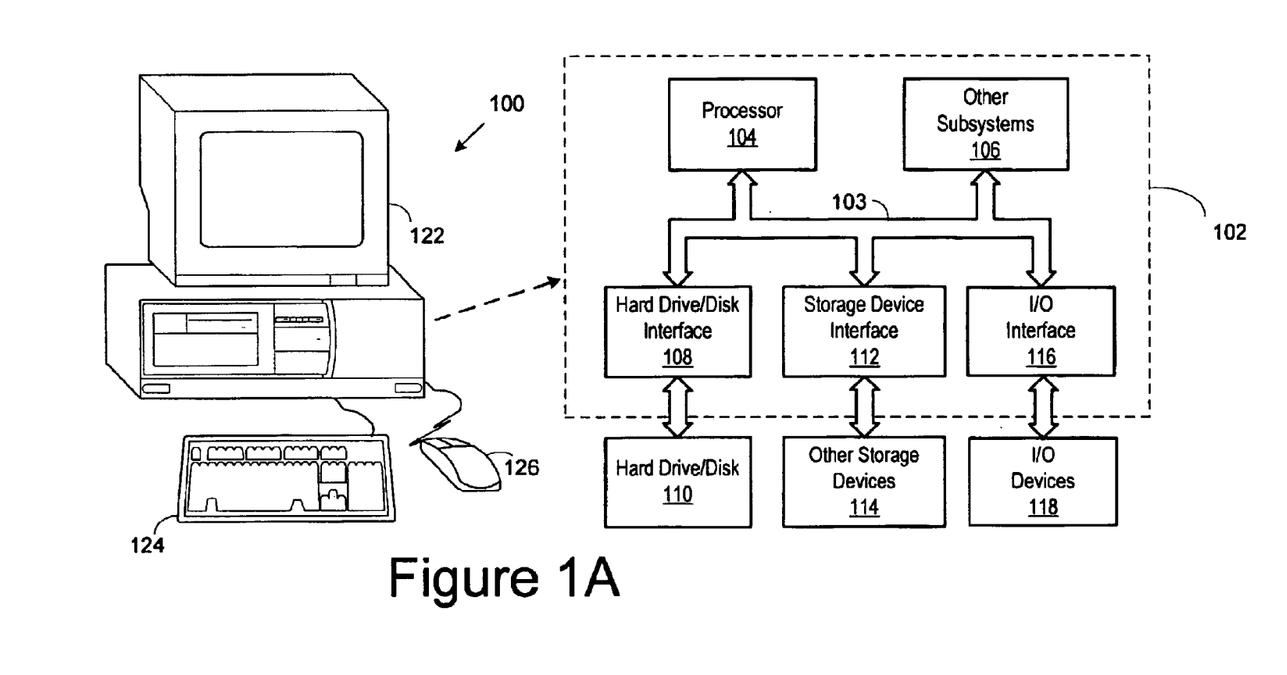
FIG. 1A is a general illustration of components of an information handling system containing circuit boards implementing the method and apparatus of the present invention for increasing routing density of signal conductors on a printed circuit board.

The method and apparatus of the present invention provides significant improvements in the manufacture and use of circuit boards such as those used in an information handling system 100 shown in FIG. 1A. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring to FIG. 1A, the information handling system 100 includes a main system board 102 that comprises a processor 104 and various other subsystems 106 understood by those skilled in the art. Data is transferred between the various system components via various data buses illustrated generally by bus 103. A hard drive 110 is controlled by a hard drive/disk interface 108 that is operably connected to the hard drive/disk 110. Likewise, data transfer between the system components and other storage devices 114 is controlled by storage device interface 112 that is operably connected to the various other storage devices 114, such as CD ROM drives, floppy drives, etc. An input/output (I/O) interface 118 controls the transfer of data between the various system components and a plurality of input/output (I/O) devices, such as a display 122, a keyboard 124, a mouse 126.

Figure 1B:
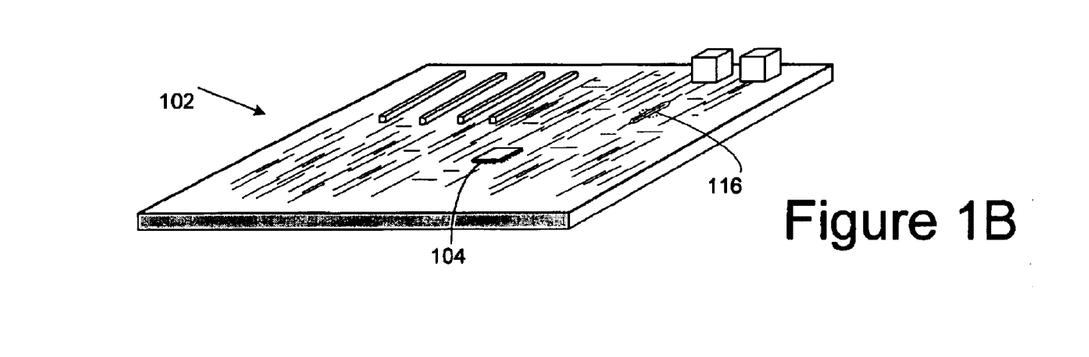
FIG. 1B is a general illustration of an information handling system circuit board implementing the method and apparatus of the present invention for increasing the routing density of signal conductors.

FIG. 1B is a generalized illustration of a printed circuit board such as system board (or motherboard) 102 discussed above in connection with FIG. 1A. Circuit boards, such as the circuit board 102 shown in FIG. 1B, often employ mixed-mode conductors that comprise both single-ended conductors and differential conductor pairs. A group of mixed-mode signal conductors is illustrated generally by reference numeral 116. As will be understood by those of skill in the art, very high data rates in printed circuit boards can lead to "cross-talk" between conductors on the circuit board leading to the injection of noise signals. This phenomenon is particularly troublesome on circuit boards that employ mixed-mode signal conductors.

Figure 2A:
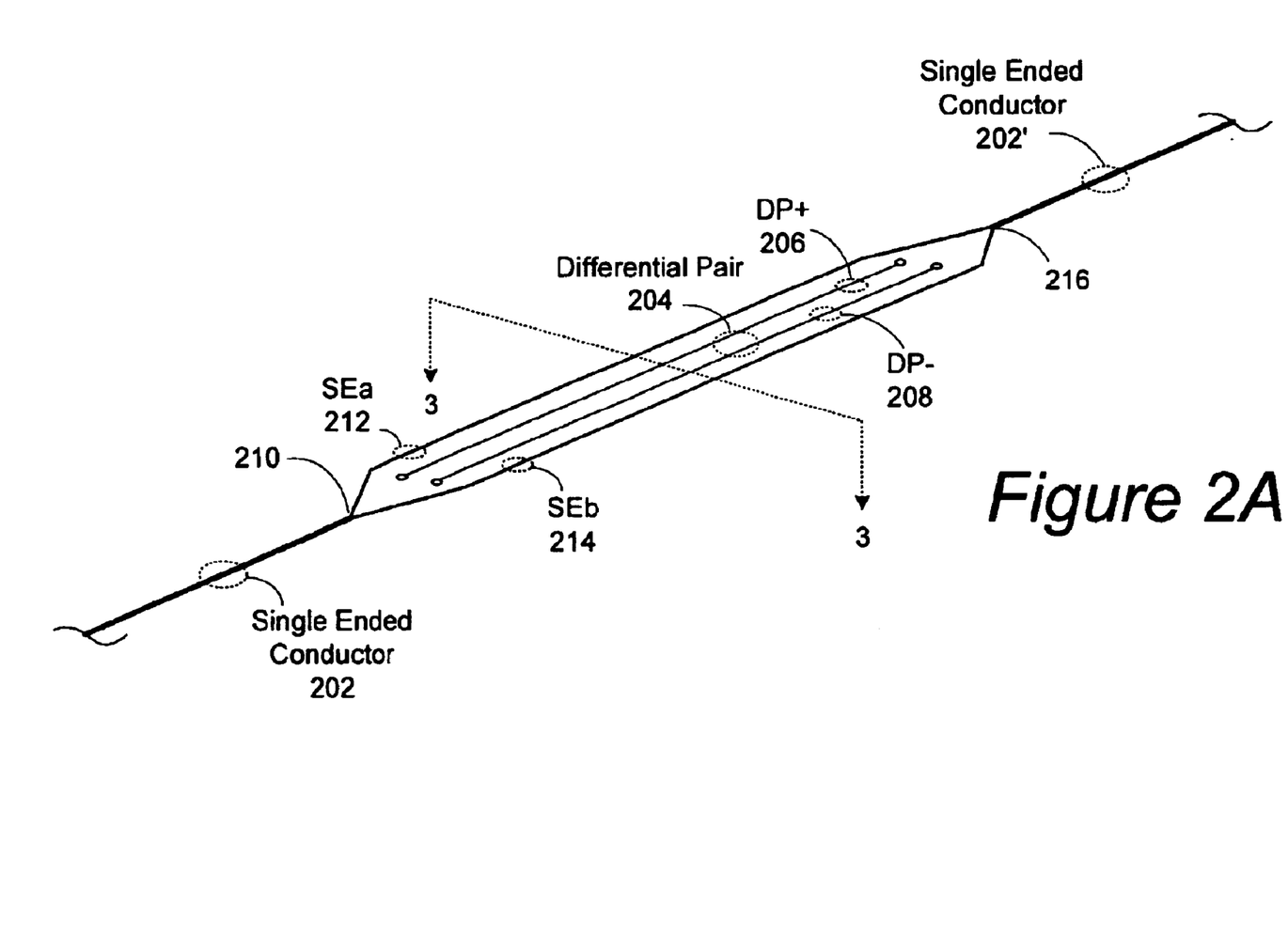
FIG. 2A is an illustration of a single-ended conductor divided into two separate single-ended conductors disposed parallel to a differential conductor pair in accordance with an embodiment of the present invention.

FIG. 2A is an illustration of a routing configuration in accordance with one embodiment of the present invention for increasing conductor routing density while minimizing or eliminating the effects of cross-talk. The conductors illustrated in FIG. 2A include single-ended signal conductor 202 and differential conductor pair 204 which further comprises individual conductors DP+206 and DP−208. To minimize the effects of cross talk while achieving the highest possible routing density, the single-ended conductor 202 is split into two single-ended conductors SEa 212 and SEb 214 at junction 210, corresponding to a first end of differential pair 204. As can be seen in FIG. 2A, each of the single-ended conductors SEa 212 and SEb 214 are disposed in a substantially parallel configuration alongside respective conductors of the differential pair 204. Each of the two single-ended conductors SEa 212 and SEb 214 are approximately one-half the width of the single-ended conductor 202 and, therefore, have twice the impedance of the single-ended conductor 202. Because of the parallel configuration of the connection of the two conductors SEa 212 and SEb 214, however, the total impedance remains unchanged and no impedance discontinuity is created. If noise is generated by the differential pair 204, equal and opposite noise amplitudes will be coupled onto each of the single-ended conductors SEa 212 and SEb 214. As can be seen in FIG. 2A, the two single-ended conductors SEa 212 and SEb 214 are joined to define a combined single-ended conductor 202' at junction 216 corresponding to a second end of the differential pair 204. The combined single-ended conductor 202' has substantially the same electrical conduction characteristics as single-ended conductor 202. Any noise that is coupled onto the respective individual single-ended conductors SEa 212 and SEb 214 will be cancelled when the signals are combined at junction 216. If any noise is coupled from the single-ended conductors SEa 212 and SEb 214 onto the differential pair, the noise will be eliminated at the receiving end of the differential pair as common mode noise.

Figure 2B:
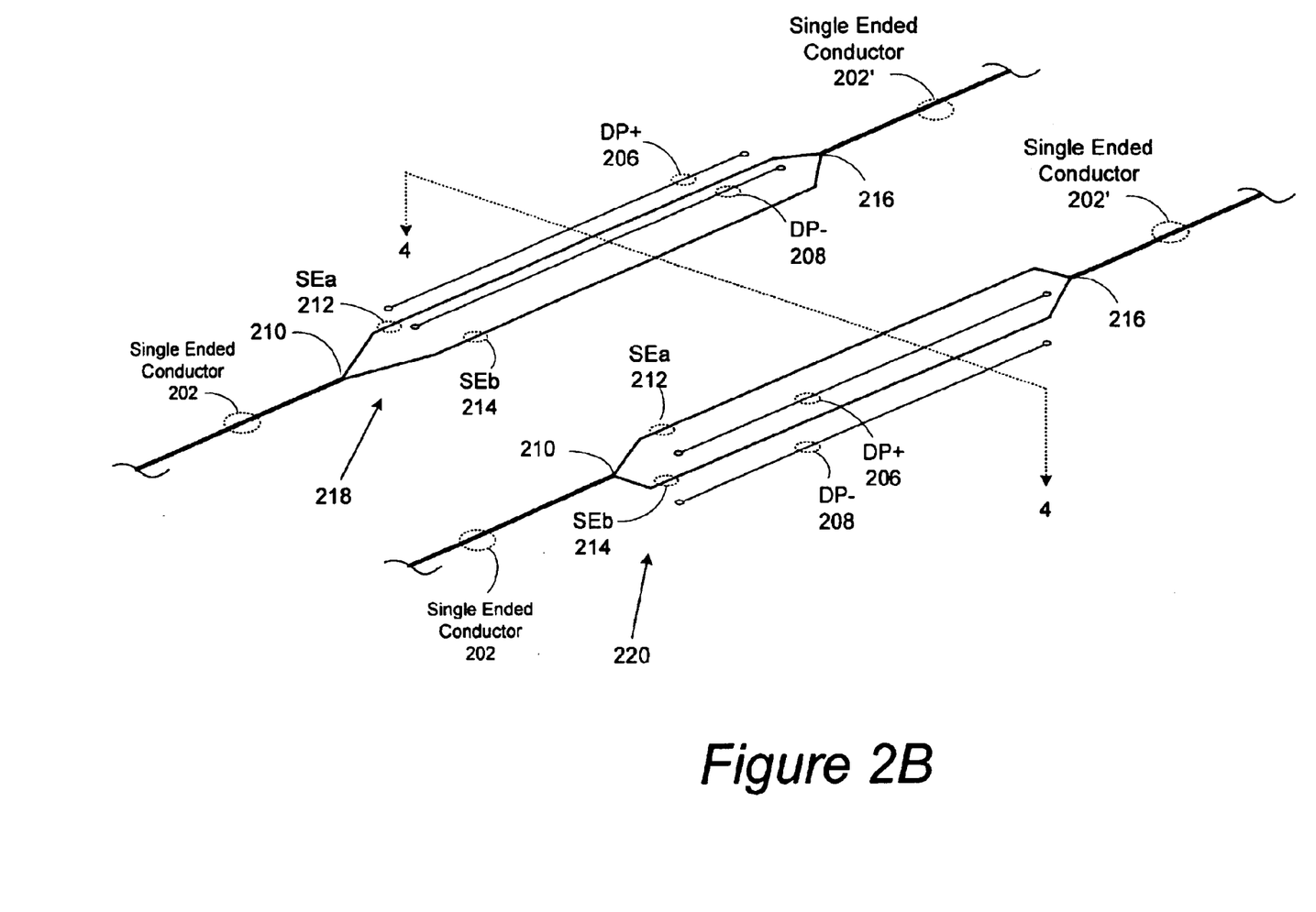
FIG. 2B is an illustration of alternate embodiments of a single-ended conductor divided into two separate single-ended conductors disposed parallel to a differential conductor pair in an edge-coupled configuration and in a broadside-coupled configuration in accordance with the present invention.

FIG. 2B illustrates the mixed-mode conductors in alternate embodiments, including an embodiment illustrated by reference numeral 218 with the differential pair in an edge-coupled configuration and an embodiment illustrated by reference numeral 220 with the differential pair in a broadside-coupled configuration. In the embodiments illustrated in FIG. 2B, the individual single-ended conductor elements do not surround the differential conductor pairs in a single plane, but are still parallel to the respective differential conductor pairs, as will be discussed in greater detail below in connection with FIG. 4.

Figure 3:
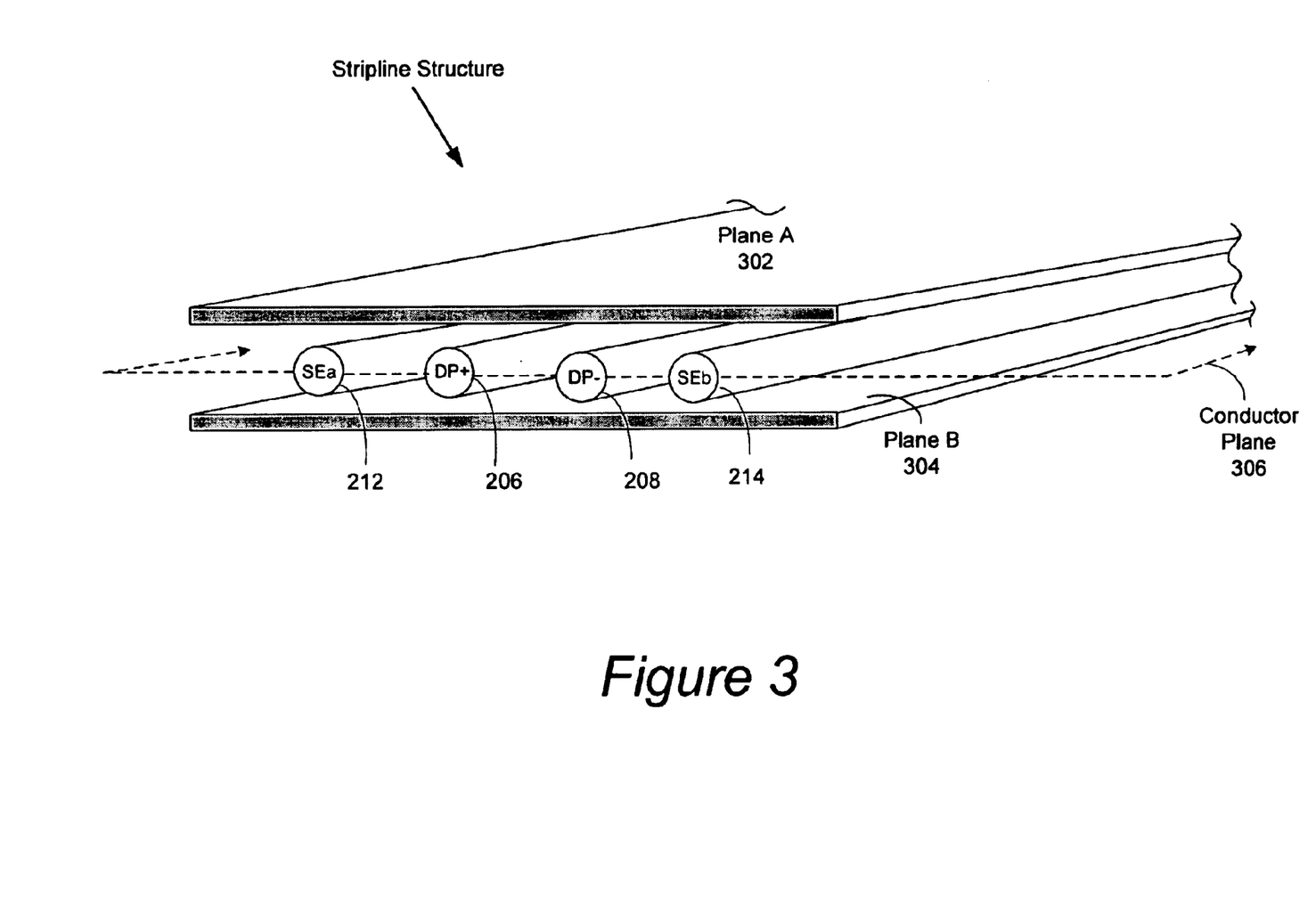
FIG. 3 is an illustration of a stripline structure for routing single-ended conductors and differential conductor pairs in accordance with the present invention.

FIG. 3 is an illustration of a stripline structure employing the conductor routing techniques discussed above in connection with FIG. 2A to achieve maximum conductor density. In accordance with the stripline configuration, the mixed-mode signal conductors are aligned in a conductor plane 306 that is disposed between first and second planes illustrated by Plane A 302 and Plane B 304 that can perform conductor and shielding functions understood by those of skill in the art The single-ended conductors SEa 212 and SEb 214 are routed alongside the differential conductor pair 206 and differential conductor pair 208, respectively, as discussed above in connection with FIG. 2A. While not explicitly shown in FIG. 3, it will be understood that the ends of the individual single-ended conductors SEa 212 and SEb 214 are connected to achieve the noise rejection characteristics of the single-ended conductor 202–202' illustrated in FIG. 2A. As a result, any noise that is coupled onto the respective individual single-ended conductors SEa 212 and SEb 214 will be cancelled when the signals are combined (e.g., at junction 216 shown in FIG. 2A). Furthermore, as discussed above, any noise coupled from the single-ended conductors SEa 212 and SEb 214 onto differential pair will be eliminated at the receiving end of the differential pair as common mode noise.

Figure 4:
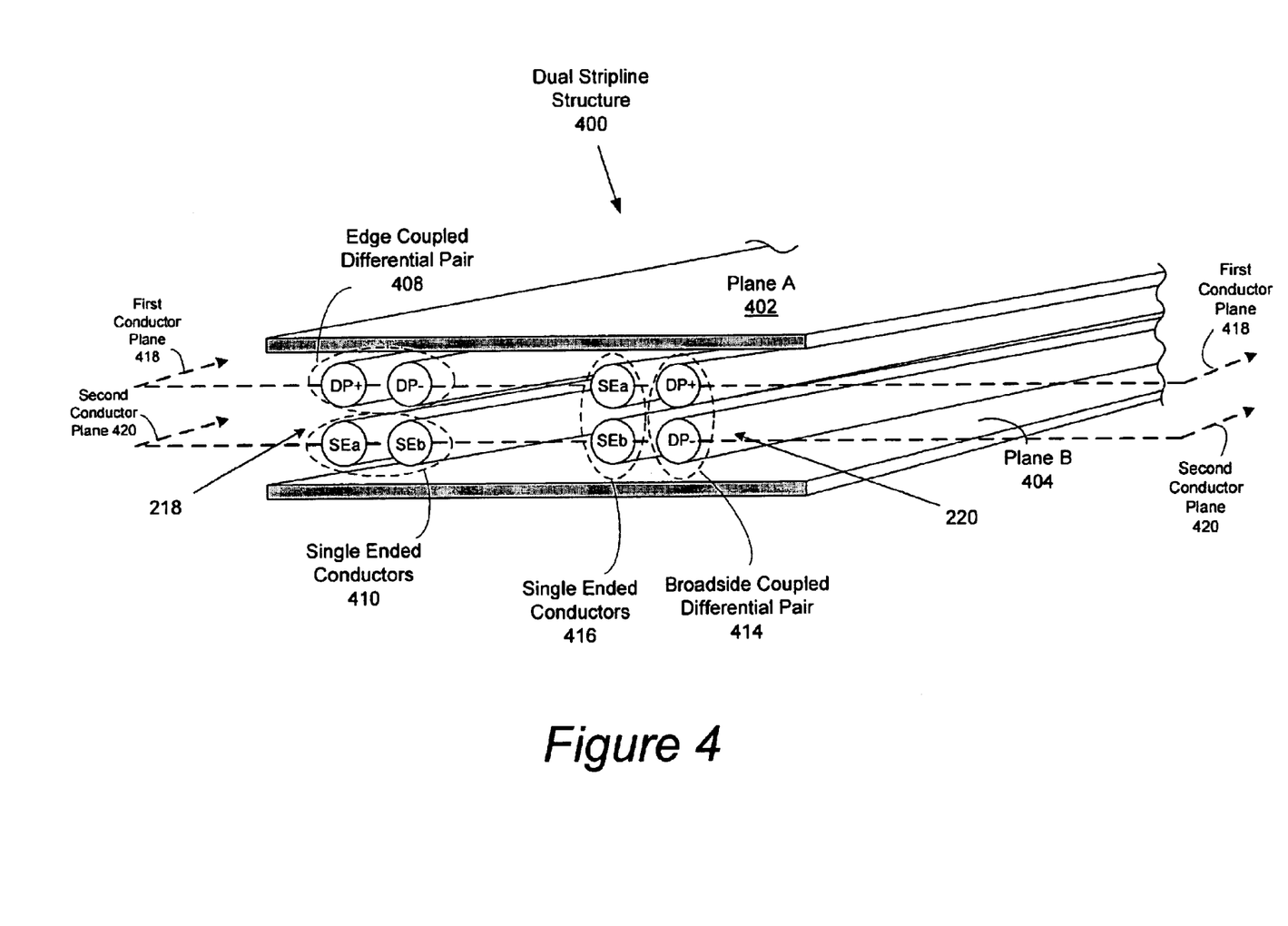
FIG. 4 is an illustration an embodiment of the present invention in a dual stripline configuration for placing differential pairs and single-ended pairs between first and second planes in either an edge-coupled or broadside-coupled configuration to minimize crosstalk between the active conductors.

FIG. 4 is an illustration of other embodiments of the method and apparatus of the present invention wherein mixed-mode conductors are arranged to achieve maximum routing density in a dual stripline configuration. In this embodiment, a plurality of mixed-mode conductors are disposed between two conductor planes illustrated by first conductor plane 418 and second conductor plane 420. The two conductor planes are disposed between Plane A 402 and Plane B 404 that can be used for conductor or shielding functions as discussed above. The mixed-mode pairs shown at the left of FIG. 4, designated by reference numeral 218, include a differential conductor pair 408 arranged in an edge-coupled configuration and a pair of single-ended conductors 410. The various DP+, DP−, SEa, and SEb conductors illustrated in FIG. 4 correspond to the respective elements shown in FIG. 2B for the mixed-mode conductor groups 218 and 220. The mixed-mode pairs shown at the right of FIG. 4, designated by reference numeral 220, include a differential conductor pair 414 arranged in a broadside-coupled configuration and a pair of single-ended conductors 416. Although not explicitly shown in FIG. 4, it will be understood that the ends of the individual single-ended conductor pairs 410 and 416 are connected to achieve the noise rejection characteristics of the single-ended conductor 202–202' shown in the embodiments of FIG. 2B. As a result, any noise that is coupled onto the single-ended conductors 410 or 416 will be cancelled when the signals are combined (e.g., at junction 216 shown in FIG. 2B). Furthermore, as discussed above, any noise coupled from the single-ended conductors 410 or 416 onto the differential conductor pairs 408 or 414, respectively, will be eliminated at the receiving end of the differential pair as common mode noise.

The conductors illustrated in FIGS. 2A, 2B, 3 and 4 have been shown in a generally cylindrical form with a round cross-section; however, it will be understood by those skilled in the art that the teachings of the present invention can be applied to conductors having other cross-sections, e.g., rectangular cross-sections or elliptical cross-sections.

The principles described herein also can be applied to conductors in a variety of spacing configurations. In typical printed circuit boards, the spacing between individual conductors in a differential pair is approximately 8 mils and the spacing between different conductor pairs often exceeds 20 mils. Using the principles of the present invention, mixed-mode conductors can be spaced at distances that approach the tolerance limits of manufacturing machinery used to fabricate the circuit conductors.

Although the present invention has been described in detail, it should be understood that various changes, substitutions and alterations can be made hereto without departing from the spirit and scope of the invention as defined by the appended claims.

What is claimed is:

1. A circuit board for minimizing interference between mixed-mode signal conductors, comprising:
   first and second differential conductors aligned in a parallel longitudinal direction from a
      first point to a second point of said circuit board; a substantially linear single-ended conductor having a portion thereof divided into first
      and second single-ended conductor components, wherein:
      said first single-ended conductor is aligned substantially parallel with said first conductor of said differential conductor pair; and
      said second single-ended conductor is aligned substantially parallel with said second conductor of said differential conductor pair; and
   wherein said first and second single-ended conductors are connected at junctions corresponding to said first point and said second point to define a combined single-ended conductor that minimizes crosstalk interference between said differential pair and said combined single-ended conductor.

2. The circuit board according to claim 1, wherein said first and second differential conductors are disposed in a first plane of said circuit board and said connected pair of first and second single-ended conductors are also disposed in said first plane in a configuration to surround said first and second differential conductors within said first plane.

3. The circuit board according to claim 1, wherein said first and second single-ended conductors have substantially the same cross-section and substantially the same impedance characteristics.

4. A circuit board for minimizing interference between mixed-mode signal conductors, comprising:
   first and second differential conductors aligned in a parallel longitudinal direction from a first point to a second point of said circuit board;
   a first single-ended conductor aligned substantially parallel with said first conductor of said differential conductor pair;
   a second single-ended conductor aligned substantially parallel with said second conductor of said differential conductor pair;
   wherein said first and second single-ended conductors are connected at junctions corresponding to said first point and said second point to define a combined single-ended conductor that minimizes crosstalk interference between said differential pair and said combined single-ended conductor; and
   wherein said first and second differential conductors are disposed in a first plane of said circuit board and said first and second single-ended conductors are disposed in a second plane of said circuit board.

5. A circuit board for minimizing interference between mixed-mode signal conductors, comprising:
   first and second differential conductors aligned in a parallel longitudinal direction from a first point to a second point of said circuit board;
   a first single-ended conductor aligned substantially parallel with said first conductor of said differential conductor pair;
   a second single-ended conductor aligned substantially parallel with said second conductor of said differential conductor pair;
   wherein said first and second single-ended conductors are connected at junctions corresponding to said first point and said second point to define a combined single-ended conductor that minimizes crosstalk interference between said differential pair and said combined single-ended conductor; and
   wherein said first differential conductor and said first single-ended conductor are disposed in a first plane of said circuit board and said second differential conductor and said second single-ended conductor are disposed in a second plane of said circuit board.

6. A method of routing pairs of conductors on a printed circuit board to minimize crosstalk errors, comprising:
   routing first and second substantially parallel differential conductors in a first longitudinal direction in said printed circuit board;
   routing a first single-ended conductor substantially parallel to and proximate to said first differential conductor;

routing a second single-ended conductor substantially parallel to and proximate to said second differential conductor;

connecting said first and second single-ended conductors at junctions corresponding to opposite ends of said differential conductors, thereby defining a substantially linear combined single-ended conductor.

7. The method according to claim 6, wherein said first and second differential conductors are disposed in a first plane of said circuit board and said connected pair of first and second single-ended conductors are also disposed in said first plane in a configuration to surround said first and second differential conductors within said first plane.

8. The method according to claim 6, wherein said first and second single-ended conductors have substantially the same cross-section and substantially the same impedance characteristics.

9. A method of routing pairs of conductors on a printed circuit board to minimize crosstalk errors, comprising:

routing first and second substantially parallel differential conductors in a first longitudinal direction in said printed circuit board;

routing a first single-ended conductor substantially parallel to and proximate to said first differential conductor;

routing a second single-ended conductor substantially parallel to and proximate to said second differential conductor;

connecting said first and second single-ended conductors at junctions corresponding to opposite ends of said differential conductors, thereby defining a combined single-ended conductor; and wherein said first and second differential conductors are disposed in a first plane of said circuit board and said first and second single-ended conductors are disposed in a second plane of said circuit board.

10. A method of routing pairs of conductors on a printed circuit board to minimize crosstalk errors, comprising:

routing first and second substantially parallel differential conductors in a first longitudinal direction in said printed circuit board;

routing a first single-ended conductor substantially parallel to and proximate to said first differential conductor;

routing a second single-ended conductor substantially parallel to and proximate to said second differential conductor;

connecting said first and second single-ended conductors at junctions corresponding to opposite ends of said differential conductors, thereby defining a combined single-ended conductor; and wherein said first differential conductor and said first single-ended conductor are disposed in a first plane of said circuit board and said second differential conductor and said second single-ended conductor are disposed in a second plane of said circuit board.

11. An information handling system, comprising:

at least one circuit board comprising information processing circuits and a plurality of mixed-mode signal conductors, said circuit board further comprising: first and second differential conductors aligned in a parallel longitudinal direction from a first point to a second point of said circuit board;

a substantially linear single-ended conductor having a portion thereof divided into first and second single-ended conductor components, wherein:

said first single-ended conductor is aligned substantially parallel with said first conductor of said differential conductor pair; and said second single-ended conductor is aligned substantially parallel with said second conductor of said differential conductor pair; and wherein said first and second single-ended conductors are connected at junctions corresponding to said first point and said second point to define a combined single-ended conductor that minimizes crosstalk interference between said differential pair and said combined single-ended conductor.

12. The information handling system according to claim 11, wherein said first and second differential conductors are disposed in a first plane of said circuit board and said connected pair of first and second single-ended conductors are also disposed in said first plane in a configuration to surround said first and second differential conductors within said first plane.

13. The information handling system according to claim 11, wherein said first and second single-ended conductors have substantially the same cross-section and substantially the same impedance characteristics.

14. An information handling system, comprising:

at least one circuit board comprising information processing circuits and a plurality of mixed-mode signal conductors, said circuit board further comprising:

first and second differential conductors aligned in a parallel longitudinal direction from a first point to a second point of said circuit board;

a first single-ended conductor aligned substantially parallel with said first conductor of said differential conductor pair;

a second single-ended conductor aligned substantially parallel with said second conductor of said differential conductor pair;

wherein said first and second single-ended conductors are connected at junctions corresponding to said first point and said second point to define a combined single-ended conductor that minimizes crosstalk interference between said differential pair and said combined single-ended conductor; and wherein said first and second differential conductors are disposed in a first plane of said circuit board and said first and second single-ended conductors are disposed in a second plane of said circuit board.

15. An information handling system comprising:

at least one circuit board comprising information processing circuits and a plurality of mixed-mode signal conductors, said circuit board further comprising:

first and second differential conductors aligned in a parallel longitudinal direction from a first point to a second point of said circuit board;

a first single-ended conductor aligned substantially parallel with said first conductor of said differential conductor pair;

a second single-ended conductor aligned substantially parallel with said second conductor of said differential conductor pair;

wherein said first and second single-ended conductors are connected at junctions corresponding to said first point and said second point to define a combined single-ended conductor that minimizes crosstalk interference between said differential pair and said combined single-ended conductor; and wherein said first differential conductor and said first single-ended conductor are disposed in a first plane of said circuit board and said second differential conductor and said second single-ended conductor are disposed in a second plane of said circuit board.

16. A method of routing conductors in an information handling system to minimize crosstalk errors, said information handling system including a circuit board comprising information processing circuits and a plurality of mixed-mode signal conductors, said method comprising:

routing first and second substantially parallel differential conductors in a first longitudinal direction in said printed circuit board;

routing a first single-ended conductor substantially parallel to and proximate to said first differential conductor;

routing a second single-ended conductor substantially parallel to and proximate to said second differential conductor;

connecting said first and second single-ended conductors at junctions corresponding to opposite ends of said differential conductors, thereby defining a substantially linear single-ended conductor.

17. The method according to claim 16, wherein said first and second differential conductors are disposed in a first plane of said circuit board and said connected pair of first and second single-ended conductors are also disposed in said first plane in a configuration to surround said first and second differential conductors within said first plane.

18. The method according to claim 16, wherein said first and second single-ended conductors have substantially the same cross-section and substantially the same impedance characteristics.

19. A method of routing conductors in an information handling system to minimize crosstalk errors, said information handling system including a circuit board comprising information processing circuits and a plurality of mixed-mode signal conductors, said method comprising:

routing first and second substantially parallel differential conductors in a first longitudinal direction in said printed circuit board;

routing a first single-ended conductor substantially parallel to and proximate to said first differential conductor;

routing a second single-ended conductor substantially parallel to and proximate to said second differential conductor;

connecting said first and second single-ended conductors at junctions corresponding to opposite ends of said differential conductors, thereby defining a single-ended conductor; and wherein said first and second differential conductors are disposed in a first plane of said circuit board and said first and second single-ended conductors are disposed in a second plane of said circuit board.

20. A method of routing conductors in an information handling system to minimize crosstalk errors, said information handling system including a circuit board comprising information processing circuits and a plurality of mixed-mode signal conductors, said method comprising:

routing first and second substantially parallel differential conductors in a first longitudinal direction in said printed circuit board;

routing a first single-ended conductor substantially parallel to and proximate to said first differential conductor;

routing a second single-ended conductor substantially parallel to and proximate to said second differential conductor;

connecting said first and second single-ended conductors at junctions corresponding to opposite ends of said differential conductors, thereby defining a single-ended conductor; and wherein said first differential conductor and said first single-ended conductor are disposed in a first plane of said circuit board and said second differential conductor and said second single-ended conductor are disposed in a second plane of said circuit board.

* * * * *